(12) United States Patent
Kim et al.

(10) Patent No.: US 12,426,180 B2
(45) Date of Patent: Sep. 23, 2025

(54) DISPLAY APPARATUS WITH ADJUSTABLE HEIGHT

(71) Applicant: SAMSUNG ELECTRONICS CO., LTD., Suwon-si (KR)

(72) Inventors: Minkeun Kim, Suwon-si (KR); Junki Noh, Suwon-si (KR); Moah Park, Suwon-si (KR); Yonghwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 231 days.

(21) Appl. No.: 18/196,600

(22) Filed: May 12, 2023

(65) Prior Publication Data

US 2023/0284407 A1 Sep. 7, 2023

Related U.S. Application Data

(63) Continuation of application No. PCT/KR2021/002223, filed on Feb. 23, 2021.

(30) Foreign Application Priority Data

Dec. 4, 2020 (KR) .................. 10-2020-0168157

(51) Int. Cl.
*H05K 5/02* (2006.01)
*F16M 11/04* (2006.01)
*F16M 11/24* (2006.01)

(52) U.S. Cl.
CPC ......... *H05K 5/0234* (2013.01); *F16M 11/041* (2013.01); *F16M 11/24* (2013.01)

(58) Field of Classification Search
None
See application file for complete search history.

(56) References Cited

U.S. PATENT DOCUMENTS

| 7,497,410 B2 | 3/2009 | Lee |
| 7,644,897 B2 | 1/2010 | Shin |
| 9,715,249 B2 | 7/2017 | Kim et al. |

(Continued)

FOREIGN PATENT DOCUMENTS

| JP | 2021-117406 | 8/2021 |
| KR | 10-0606771 | 7/2006 |

(Continued)

OTHER PUBLICATIONS

International Search Report, PCT/ISA/210, dated Sep. 1, 2021, in PCT Application No. PCT/KR2021/002223.

(Continued)

*Primary Examiner* — Allen L Parker
*Assistant Examiner* — Christopher L Augustin
(74) *Attorney, Agent, or Firm* — STAAS & HALSEY LLP

(57) ABSTRACT

A display apparatus including a stand and a height adjustment member, wherein the stand comprises: a display panel; a housing accommodating the display panel and including a rear cover for covering the rear of the display panel; a base disposed behind the rear cover to support the housing; and a support protrusion protruding from the base such that the housing can be supported in a first position having a first height, and wherein the height adjustment member is coupled to the stand to support the housing in a second position having a second height.

17 Claims, 13 Drawing Sheets

(56) References Cited

U.S. PATENT DOCUMENTS

| | | | |
|---|---|---|---|
| 10,253,921 B2 | 4/2019 | Yoon et al. | |
| 10,721,341 B2* | 7/2020 | Koh | H04M 1/026 |
| 11,567,546 B2 | 1/2023 | Kim et al. | |
| 2005/0041379 A1* | 2/2005 | Jang | F16M 11/045 |
| | | | 248/917 |
| 2007/0045488 A1* | 3/2007 | Shin | F16M 11/24 |
| | | | 248/176.1 |
| 2007/0145212 A1* | 6/2007 | Yamanaka | F16M 11/22 |
| | | | 248/176.1 |
| 2008/0251678 A1* | 10/2008 | Lien | F16M 11/10 |
| | | | 248/404 |
| 2011/0255222 A1* | 10/2011 | Fan | F16M 11/046 |
| | | | 248/407 |
| 2014/0029176 A1* | 1/2014 | Chiang | G06F 1/1601 |
| | | | 361/679.01 |
| 2014/0353453 A1* | 12/2014 | Quijano | F16M 11/18 |
| | | | 248/419 |
| 2015/0308608 A1* | 10/2015 | Lei | F16M 11/24 |
| | | | 361/679.01 |
| 2020/0200321 A1* | 6/2020 | Chen | G06F 1/1601 |

FOREIGN PATENT DOCUMENTS

| | | |
|---|---|---|
| KR | 10-0630938 | 10/2006 |
| KR | 10-2006-0125099 | 12/2006 |
| KR | 10-0846898 | 7/2008 |
| KR | 10-0873131 | 12/2008 |
| KR | 10-2011-0032516 | 3/2011 |
| KR | 10-1707110 | 2/2017 |
| KR | 10-1812332 | 12/2017 |
| KR | 10-2018-0036170 | 4/2018 |
| KR | 10-1981165 | 5/2019 |
| KR | 10-2087912 | 3/2020 |
| KR | 10-2091540 | 3/2020 |
| KR | 10-2208705 | 1/2021 |
| KR | 10-2022-0008593 | 1/2022 |

OTHER PUBLICATIONS

Written Opinion, PCT/ISA/237, dated Sep. 1, 2021, in PCT Application No. PCT/KR2021/002223.

* cited by examiner

DISPLAY APPARATUS WITH ADJUSTABLE HEIGHT

CROSS-REFERENCE TO RELATED APPLICATIONS

This application is a continuation application of International Application PCT/KR2021/002223, filed Feb. 23, 2021, and claims foreign priority to Korean Application 10-2020-0168157, filed Dec. 4, 2020, the disclosures of which are incorporated herein by reference in their entireties.

BACKGROUND

1. Field

The present disclosure relates to a display apparatus, and more specifically, to a display apparatus of which a height is adjustable.

2. Description of Related Art

Generally, display apparatuses are apparatuses that display images on a screen, such as televisions, computer monitors, digital information displays, and the like.

In appearance, a housing and a display panel are disposed close to a floor surface. However, when a peripheral apparatus such as a sound bar is installed in front of a display panel, the peripheral apparatus may cover a portion of the display panel.

Therefore, there is a need for a apparatus in which, when there is no peripheral apparatus such as a sound bar, a display panel is disposed close to a floor surface, and when there is a peripheral apparatus, the display panel can move upward not to cover the display panel.

SUMMARY

One aspect of the disclosure provides a display apparatus including a display panel, a housing accommodating the display panel and including a rear cover covering a rear of the display panel, a stand including a base, and a support protrusion protruding from the base and configured to support the housing in a first position at a first height, and a height adjustment member is coupled to the stand and configured to support the housing in a second position at a second height.

While the housing is supported in the first position, the support protrusion may protrude toward the rear cover, and an upper end of the height adjustment member may be positioned at a lower level than the support protrusion.

The height adjustment member may include a support surface rotatably coupled to the support protrusion and supporting the housing while the housing is supported in the second position.

The height adjustment member may include a first side facing the rear cover and a second side facing the base while the housing is supported in the first position, and the first side may face the base and the second side may face the rear cover according to rotation of the height adjustment member.

The rear cover may include a contact surface in contact with the support protrusion so as to be supported by the support protrusion while the housing is supported in the first position.

The rear cover may include a recess to which the stand is slidably coupleable, and the contact surface may be supported by the support protrusion while the housing is positioned in the second position.

The stand may include a coupling part protruding toward the rear cover from the base while the housing is supported in the second position, and a coupling hole formed in the coupling part, and the height adjustment member may include a rotating shaft rotatably coupled to the coupling hole while the housing is supported in the second position.

The height adjustment member may be accommodated between the rear cover and the base while the housing is supported in the second position.

The display apparatus may further include accommodating walls protruding from the base, and a mounting part between the accommodating walls and on which the height adjustment member is mounted.

The accommodating walls may be in contact with the rear cover while the housing is supported in the second position.

The rear cover may include a fixing protrusion protruding toward the stand while the housing is supported in the first position or the second position, and the height adjustment member may include a first fixing groove provided in the first side and configured to be coupled to the fixing protrusion while the housing supported in the first position, and a second fixing groove provided in the second side and configured to be coupled to the fixing protrusion while the housing supported in the second position.

The stand may include a contact rib protruding toward the height adjustment member from the base while the housing is supported in the second position, and the height adjustment member may include a rotating part in which the rotating shaft is formed, and a protruding rib provided in the rotating part to come into contact with the contact rib and fix the height adjustment member while the housing supported in the second position.

The stand may include a plurality of fixing ribs protruding toward both side surfaces of the height adjustment member from an upper portion of the base, and configured to fit onto and couple to the height adjustment member while the housing is supported in the second position.

The height adjustment member may include a grip part recessed inward of the height adjustment member to rotate the height adjustment member.

The display apparatus may further include a bottom chassis disposed between the display panel and the rear cover, wherein the bottom chassis may include a reinforcing rib protruding toward the stand to support the contact surface while the housing is supported in the second position.

Another aspect of the disclosure provides a display apparatus including a display panel, a housing configured to accommodate the display panel, a stand coupled to a lower portion of the housing so that the housing is supported in a first position at a first height, and a height adjustment member that is coupled to the stand to support the housing in a second position at a second height and accommodated between the housing and the stand.

The housing may include a rear cover covering a rear of the display panel, the stand may include a base disposed behind the rear cover to support the housing, and the height adjustment member may be accommodated between the housing and the base.

The stand may include an accommodating wall protruding from the base and being in contact with the rear cover so that the height adjustment member is accommodated.

another aspect of the disclosure provides a display apparatus including a display panel, a rear cover configured to accommodate the display panel and cover a rear of the display panel, a housing including a fixing protrusion protruding rearward of the rear cover, a stand configured to support the rear cover so that the housing is supported in a first position at a first height, and a height adjustment member, which is a height adjustment member coupled to the stand to support the housing in a second position at a second height, including a first fixing groove provided in a first side of the height adjustment member to be coupled to the fixing protrusion and a second fixing groove provided in a second side of the height adjustment member while the housing supported in the first position, wherein the second fixing groove may be coupled to the fixing protrusion while the housing supported in the second position.

The height adjustment member may be rotatably coupled to the stand, the first side may face the rear cover and the second side may face the stand while the housing supported in the first position, and the first side may face the stand and the second side may face the rear cover according to rotation of the height adjustment member.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
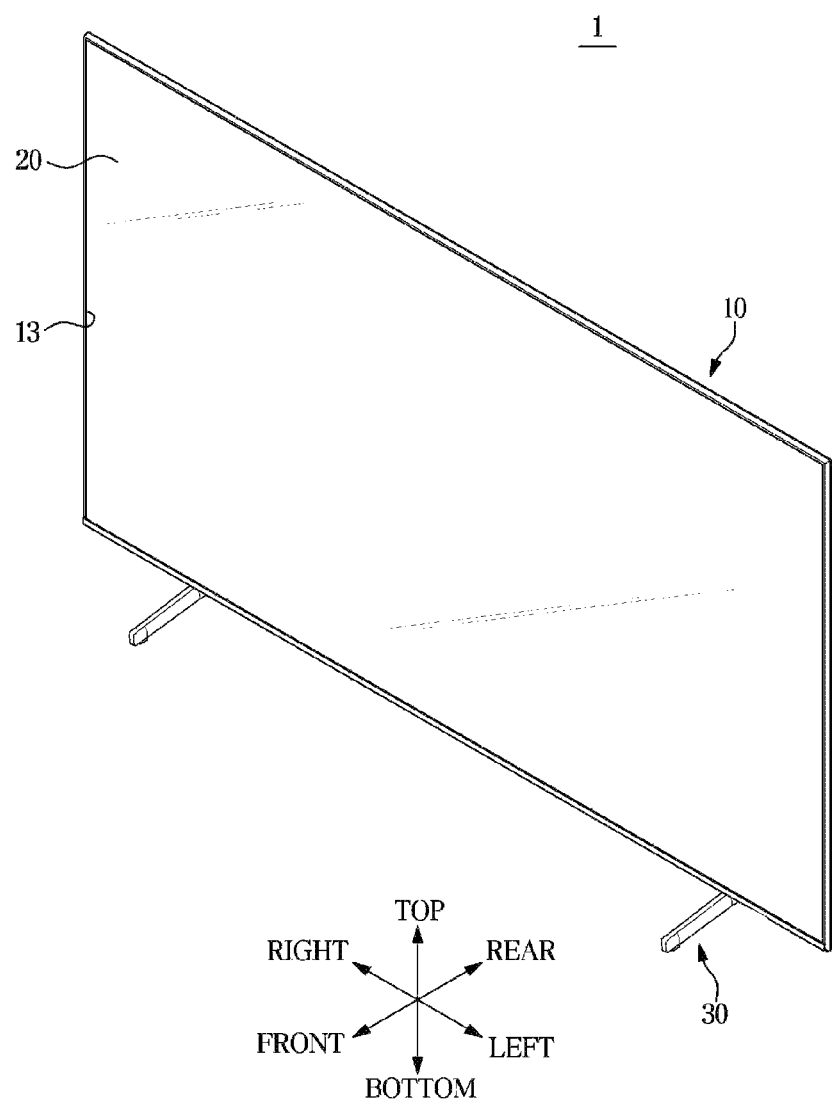
FIG. 1 is a view illustrating a display apparatus according to an embodiment of the disclosure.

Embodiments described in this specification and configurations shown in the accompanying drawings are only exemplary examples of the disclosed invention. It should be understood that the disclosure covers various modifications that can substitute for the embodiments herein and drawings at the time of filing of this application.

Further, like reference numerals or designations presented in each drawing in this specification may refer to like parts or components performing substantially the same function.

Further, it should be understood that the terminology used herein is for the purpose of describing particular embodiments only and is not intended to limit and/or restrict the disclosed invention. As used herein, the singular forms "a" and "an" are intended to include the plural forms as well, unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Further, it will be understood that, although the terms first, second, etc. may be used herein to describe various elements, these elements should not be limited by these terms. These terms are used only to distinguish one element from another element. For example, a first element could be termed a second element, and similarly, a second element could be termed a first element without departing from the scope of the disclosure. As used herein, the term "and/or" includes any and all combinations of one or more of the associated listed items.

Meanwhile, the terms "front," "rear," "left," and "right" used in the following descriptions are defined based on the accompanying drawings, and a shape and position of each component are not limited by these terms.

Specifically, as illustrated in FIG. 1, a direction in which a display panel 20 is illustrated is defined as a forward direction, and a rearward direction, a left-right direction, and a top-bottom direction are defined based on the forward direction.

Various embodiments of the disclosure are directed to providing a display apparatus of which heights of a housing and a display panel are adjustable.

Moreover, various embodiments of the disclosure are directed to providing a display apparatus which allows a user to easily adjust a height of a display panel.

According to various embodiment of the disclosure, a display apparatus which allows a user to easily adjust heights of a housing and a display panel using a stand is provided.

Hereinafter, embodiments of the disclosure will be described in detail with reference to the accompanying drawings.

Figure 2:
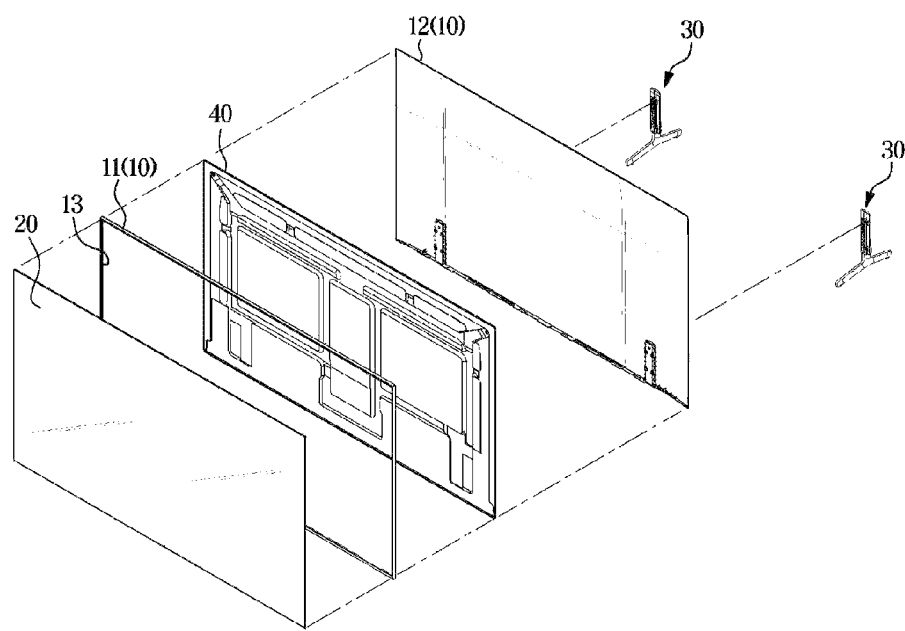
FIG. 2 is an exploded perspective view of the display apparatus illustrated in FIG. 1.
Figure 3:
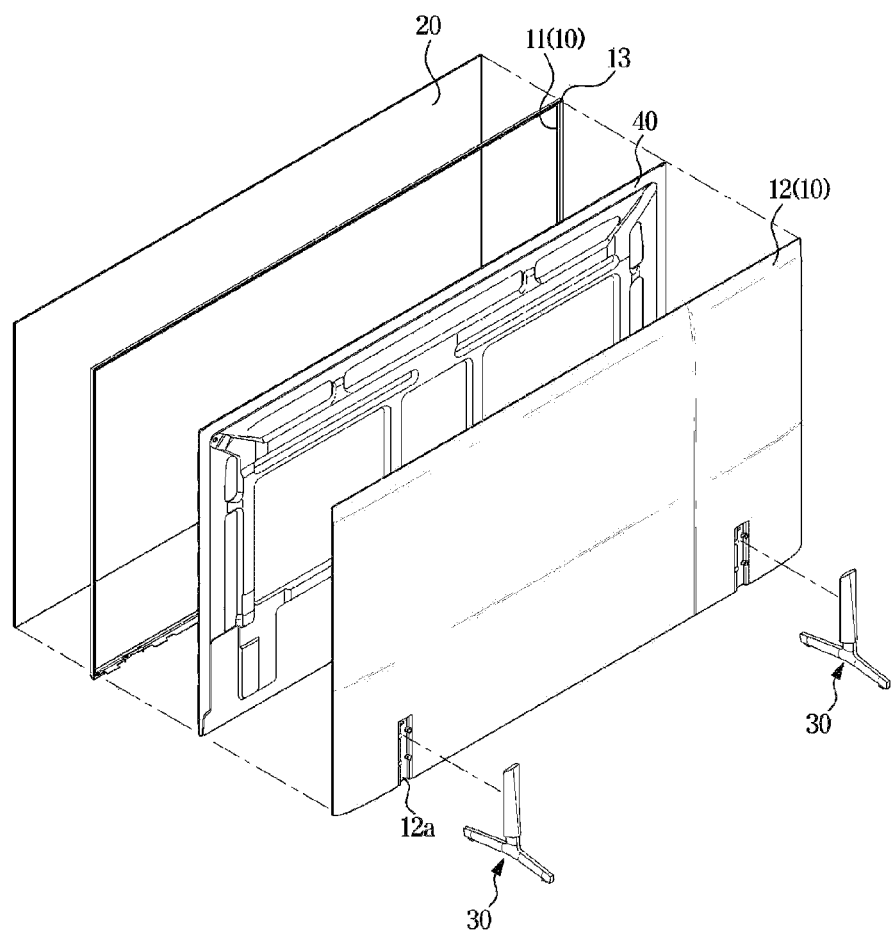
FIG. 3 is a view illustrating the display apparatus illustrated in FIG. 2 at another angle.

FIG. 1 is a view illustrating a display apparatus according to an embodiment of the disclosure. FIG. 2 is an exploded perspective view of the display apparatus illustrated in FIG. 1. FIG. 3 is a view illustrating the display apparatus illustrated in FIG. 2 at another angle.

Referring to FIGS. 1 to 3, a display apparatus 1 may include a housing 10 forming an exterior thereof. The housing 10 may include an opening 13. Specifically, the opening 13 may be formed in a front surface of the housing 10.

The display apparatus 1 may further include a bottom chassis 40 coupled to an outer frame 11 behind the display panel 20. The outer frame 11 and the display panel 20 may be coupled in various ways.

The housing may include the outer frame 11. The outer frame 11 may have a box shape with open front and rear surfaces. The open front surface of the outer frame 11 may be defined as the opening 13. That is, the opening 13 may be formed in the front surface of the outer frame 11.

The housing 10 may further include a rear cover 12. The rear cover 12 may be coupled to the outer frame 11. Specifically, the rear cover 12 may be coupled to the open rear surface of the outer frame 11 to form an exterior of the display apparatus 1 together with the outer frame 11.

The display apparatus 1 may further include the display panel 20. The display panel 20 may be disposed inside the housing 10. The display panel 20 may include a liquid crystal panel, a light-emitting diode (LED) panel, or a glass LED panel. However, the disclosure is not limited thereto.

The display apparatus 1 may further include a stand 30 coupled to the housing 10. The stand 30 may be coupled to the housing 10 behind the rear cover 12 to support the housing 10. The stand 30 may be detachably coupled to a lower end portion of the housing 10. The stand 30 may support the housing 10 so that the housing 10 that accommodates the display panel 20 can stand on the floor. That is, the stand 30 may support the housing 10 so that the housing 10 does not fall down while the housing 10 is placed on the floor.

The rear cover 12 may include a recess 12a into which the stand 30 is inserted. The recess 12a may be formed by being recessed.

A plurality of stands 30 may be provided. That is, the plurality of stands 30 may be disposed to be spaced apart from each other in a left-right direction. Although two stands are illustrated in the drawings, the number of stands 30 is not limited thereto.

Although not illustrated in the drawings, the display apparatus 1 may include a plurality of optical sheets, a backlight unit that emits light, and a control module that controls internal components of the display apparatus. Detailed descriptions thereof will be omitted.

It will be easily understood by those skilled in the art that the components included in the display apparatus 1 can be changed in response to slimming of the display apparatus 1.

Figure 4:
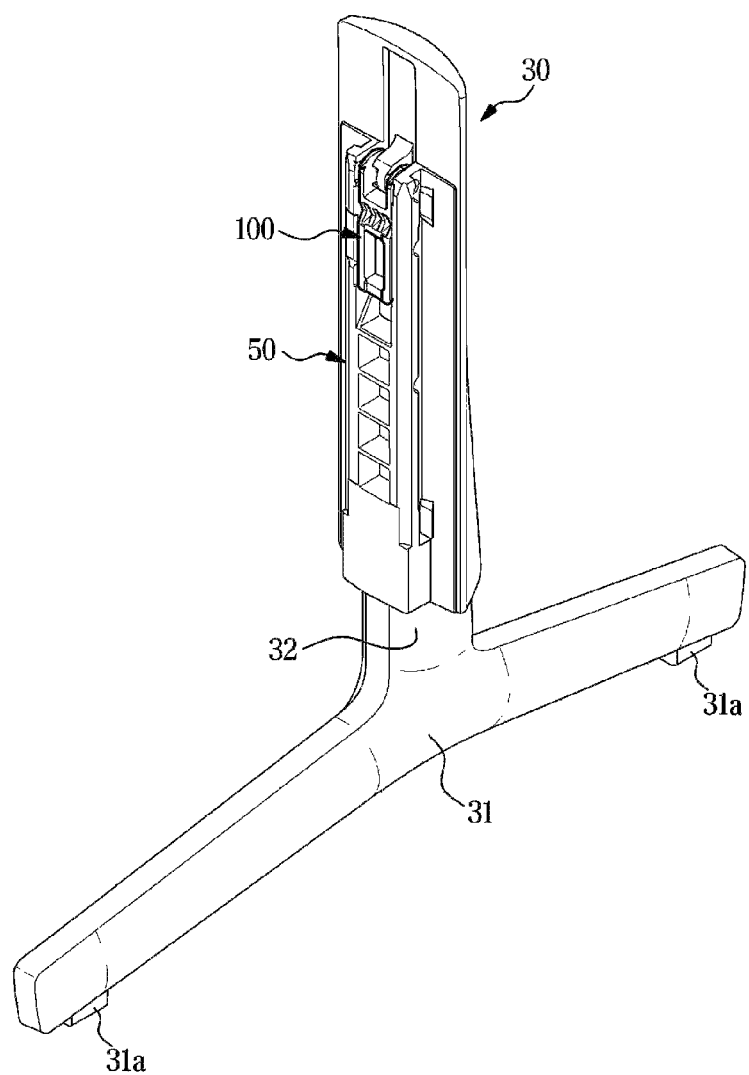
FIG. 4 is a view illustrating a height adjustment member while a stand and a housing are supported in a first position in the display apparatus illustrated in FIG. 1.
Figure 5:
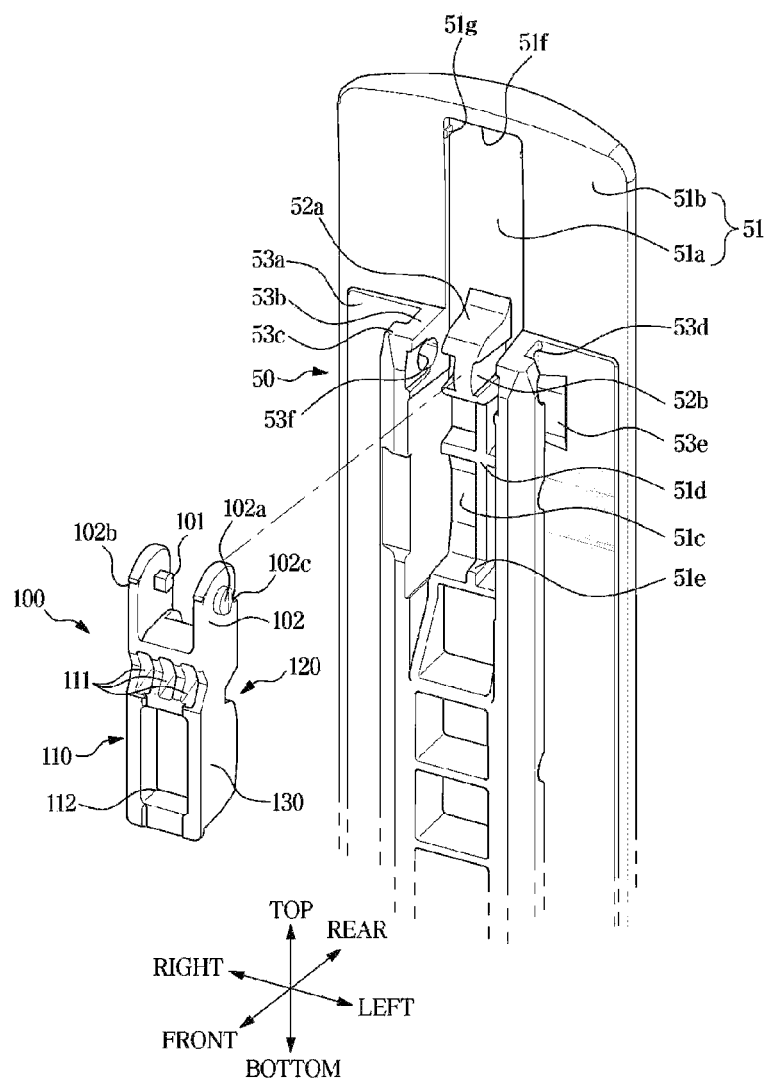
FIG. 5 is a view illustrating a coupling relationship between the stand and the height adjustment member illustrated in FIG. 4.
Figure 6:
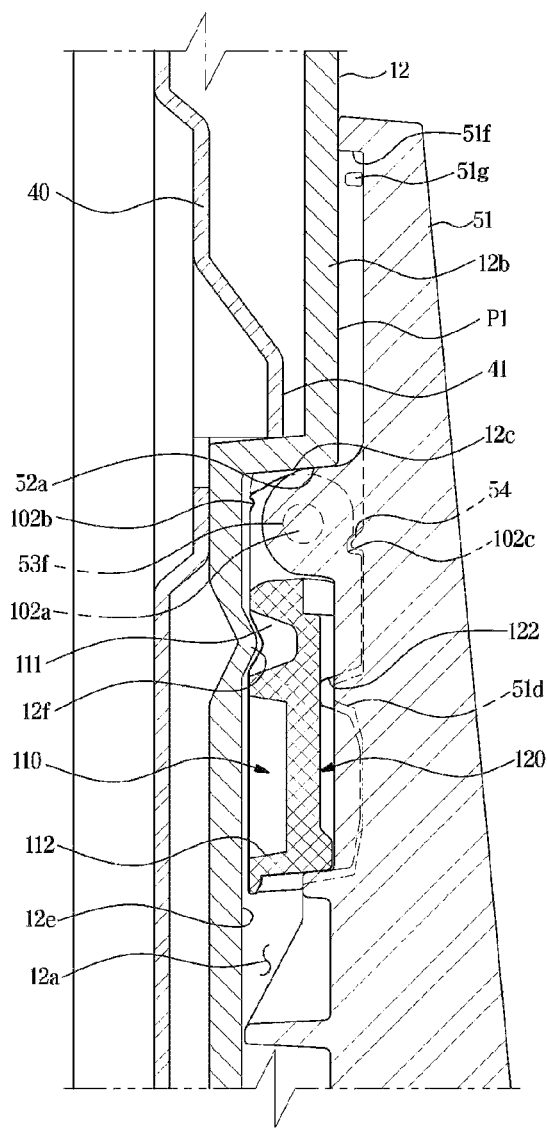
FIG. 6 is a cross-sectional view illustrating the height adjustment member while the housing is supported in the first position in the display apparatus illustrated in FIG. 4.

FIG. 4 is a view illustrating a height adjustment member while a stand and a housing are supported in a first position in the display apparatus illustrated in FIG. 1. FIG. 5 is a view illustrating a coupling relationship between the stand and the height adjustment member illustrated in FIG. 4. FIG. 6 is a cross-sectional view illustrating the height adjustment member while the housing is supported in the first position in the display apparatus illustrated in FIG. 4.

Referring to FIGS. 4 to 6, the stand 30 may include a holder 31 provided in a lower end portion thereof to support the housing 10, a neck 32 that extends upward from the holder 31, and a mounting part 50 that extends upward from the neck 32. The mounting part 50 may become a part that comes into contact with and is coupled to the rear cover 12.

The mounting part 50 may be slidably mounted on the rear cover 12. Holding protrusions 31a may be provided beneath the holder 31. The holding protrusions 31a may come into contact with the ground to support the stand 30.

The stand 30 may include the mounting part 50. The mounting part 50 may be provided to allow a height adjustment member 100 to be mounted on the stand 30. The mounting part 50 may include a base 51, a support protrusion 52, and a coupling part 53.

The base 51 may be provided behind the housing 10 to support the rear cover 12. The base 51 may be provided on an upper portion of the neck 32. The base 51 may include a recessed part 51a in which the support protrusion 52 is formed, a rear support 51b that comes into contact with the rear cover 12, and a mounting part 51c which is provided to allow the height adjustment member 100 to be mounted thereon while the housing 10 is supported in a first position P1.

The recessed part 51a may be recessed rearward from the rear support 51b. The recessed part 51a may allow the height adjustment member 100 to be stably accommodated in the base 51 and the rear cover 12 while the height adjustment member 100 is mounted on the mounting part 51c. Further, the recessed part 51a may allow the height adjustment member 100 to be stably accommodated in the base 51 and the rear cover 12 while the height adjustment member 100 supports the housing 10 in a second position P2. The recessed part 51a may include an upper surface 51f.

The stand 30 may include fixing ribs 51g that protrude inward of the recessed part 51a from left and right surfaces forming the recessed part 51a. A plurality of fixing ribs 51g may be provided. The fixing ribs 51g may allow the height adjustment member 100 to be fitted into the recessed part 51a while the height adjustment member 100 supports the housing 10 in the second position P2. Accordingly, while the housing 10 is supported in the second position P2, the height adjustment member 100 may not be easily separated and may be prevented from being reversely rotated.

The mounting part 51c may be provided to accommodate the height adjustment member 100 while the housing 10 is supported in the first position P1. The mounting part 51c may be formed by an accommodating wall which will be described below.

The stand 30 may include mounting protrusions 51d and 51e. The mounting protrusions 51d and 51e may be formed to correspond to mounting grooves 122 and 123a provided in the height adjustment member 100. That is, a plurality of mounting protrusions 51d and 51e may be provided. The plurality of mounting protrusions 51d and 51e may include a first mounting protrusion 51d and a second mounting protrusion 51e.

The first mounting protrusion 51d may extend in a top-bottom direction and a left-right direction. The first mounting protrusion 51d may be formed to correspond to a first mounting groove 122 of the height adjustment member 100. Specifically, the first mounting protrusion 51d may be formed to correspond to a second fixing groove 121 while the housing 10 is supported in the first position P1. The second mounting protrusion 51e may protrude upward from a lower surface of the mounting part 51c. The second mounting protrusion 51e may be formed to correspond to a second mounting groove 123a of the height adjustment member 100.

The stand 30 may further include the support protrusion 52. The support protrusion 52 may protrude toward the rear cover 12 from the base 51. That is, the support protrusion 52 may protrude forward from the base 51. Specifically, the support protrusion 52 may protrude toward the rear cover 12 from the recessed part 51a to support the housing 10 while the housing 10 is supported in the first position P1. The support protrusion 52 may stably support the housing 10 while the housing 10 is supported in the first position P1.

The support protrusion 52 may include a housing support surface 52a and an inner protrusion accommodating part 52b. The housing support surface 52a may be formed on an upper surface of the support protrusion 52. The housing support surface 52a may be in contact with a contact surface 12c of the rear cover 12 to allow the housing 10 to be supported in the first position P1. That is, the housing 10 may be supported by the housing support surface 52a provided in the support protrusion 52 in the first position P1. The inner protrusion accommodating part 52b may be provided to accommodate an inner protrusion 101 provided in the height adjustment member 100. That is, the inner protrusion accommodating part 52b may be formed by being recessed inward of the support protrusion 52.

The stand 30 may include the coupling part 53 provided to be coupled to the housing 10. The coupling part 53 may be provided in a shape corresponding to that of the recess 12a provided in the rear cover 12 and strength reinforcing members 14. The coupling part 53 may be referred to as a guide flange 53.

The guide flange 53 may include first flange parts 53a, second flange parts 53b, third flange parts 53c, and sliding parts 53d.

The first flange part 53a may protrude toward the rear cover 12 from the base 51. The second flange part 53b may extend forward from the first flange part 53a. The third flange part 53c may extend left and right from an end portion of the second flange part 53b. That is, the third flange part 53c may extend left and right from a front end portion of the second flange part.

The sliding part 53d may be provided between the first flange part 53a, the second flange part 53b, and the third flange part 53c. The stand 30 may be slidably coupled to the rear cover 12 through the sliding part 53d. The sliding part 53d may be formed to correspond to the strength reinforcing member 14.

The second flange part 53b may become an accommodating wall 53b. The accommodating wall 53b may protrude toward the rear cover 12 from the base 51. That is, the accommodating wall 53b may protrude forward from the base 51. The accommodating wall 53b may form the mounting part 51c in which the height adjustment member 100 is accommodated. Since the accommodating wall 53b forms the mounting part 51c, the height adjustment member 100 may be accommodated between the rear cover 12 and the stand 30. Further, the accommodating wall 53b may be in contact with the rear cover 12. Accordingly, since the height adjustment member 100 is not exposed to the outside of the display apparatus, there is an aesthetic advantage. Further, even while the housing 10 is supported in the first position P1, the height adjustment member 100 may be accommodated in the mounting part 51c without need to be stored separately. As a result, a risk of loss of the height adjustment member 100 can be reduced.

The coupling part 53 may include a step 53e. While the stand 30 is coupled to the housing 10, the step 53e may come into contact with the strength reinforcing member 14.

The coupling part 53 may include a coupling hole 53f. The coupling hole 53f may be formed in the accommodating wall. The coupling hole 53f may allow the height adjustment member 100 to be rotatably coupled to the stand 30. That is, the coupling hole 53f may be coupled to a rotating shaft 102a of the height adjustment member 100. Accordingly, the height adjustment member 100 may rotate to support the housing 10 in the second position P2.

The stand 30 may include a contact rib 54. The contact rib 54 may protrude toward the rear cover 12 from the base 51. That is, the contact rib 54 may protrude forward. The contact rib 54 may come into contact with a protruding rib 102b provided in the height adjustment member 100 while the housing 10 is supported in the second position P2 by the height adjustment member 100. Therefore, it is possible to prevent the height adjustment member 100 from being reversely rotated.

The display apparatus may further include the height adjustment member 100. The height adjustment member 100 may be mounted on the stand 30 to adjust a height of the housing 10.

The height adjustment member 100 may include a first side 110 facing forward and a second side 120 facing rearward while the housing 10 is supported in the first position P1 by the support protrusion 52. That is, the first side 110 may face a mounting part accommodating surface 12e, and the second side 120 may face the recessed part 51a of the base 51. While the height adjustment member 100 supports the housing 10 in the second position P2, the first side 110 may face rearward, and the second side 120 may face forward. Further, the height adjustment member 100 may include both side surfaces 130 provided between the first side 110 and the second side 120. That is, the height adjustment member 100 may include a left surface 130 and a right surface 130.

The height adjustment member 100 may include the inner protrusion 101 and a rotating part 102.

The inner protrusion 101 may protrude inward of an upper portion of the height adjustment member 100. The inner protrusion 101 may protrude inward of the height adjustment member 100 from the rotating part 102. The inner protrusion 101 may be accommodated in the inner protrusion accommodating part 52b described above.

The rotating part 102 may be formed on the upper portion of the height adjustment member 100. The rotating part 102 may be provided to allow the height adjustment member 100 to be rotated to support the housing 10 in the second position P2. The rotating shaft 102a, the protruding rib 102b, and a contact rib accommodating groove 102c may be formed in the rotating part 102.

The rotating shaft 102a may protrude outward from the rotating part 102 to be rotatably coupled to the coupling hole 53f. That is, the rotating shaft 102a may protrude leftward and rightward from the rotating part 102. The rotating shaft 102a may protrude from the left and right surfaces of the height adjustment member 100. Since the rotating shaft 102a is coupled to the coupling hole 53f, the height adjustment member 100 may be rotated to support the housing 10 in the second position P2.

The rotating shaft 102a may be detachably coupled to the coupling hole 53f. In the drawings, only one rotating shaft 102a is illustrated as being provided on each of the left surface 130 and the right surface 130, but the disclosure is not limited thereto. For example, two rotating shafts 102a may be provided on each of the left surface 130 and the right surface 130. In this case, the rotating shaft 102a may be referred to as a coupling protrusion 102a. Therefore, since the coupling protrusion 102a is provided in plurality, a coupling protrusion 102a provided on an upper side and a coupling protrusion 102a provided on a lower side may be provided on the left surface 130 and the right surface 130, respectively. In this case, the coupling protrusion 102a provided on the upper side may be coupled to the coupling hole 53f so that the height adjustment member 100 is rotated to support the housing 10 in the second position P2 at a second height. Further, in the state in which the height adjustment member 100 is rotated, the coupling protrusion 102a provided on the upper side may be separated from the coupling hole 53f, and the coupling protrusion 102a provided on the lower side may be coupled to the coupling hole 53f. Accordingly, the height adjustment member 100 may support the housing 10 at a lower height than the second height. While the coupling protrusion 102a provided on the lower side is coupled to the coupling hole 53f, the housing 10 may be supported in a third position P3 at a third height. That is, the third position P3 may be a height between the first position P1 of and the second position P2. The third height may be greater than the first height and smaller than the second height.

The protruding rib 102b may be formed on an outer perimeter of the rotating part 102. While the housing 10 is supported in the first position P1, the protruding rib 102b may protrude forward. The protruding rib 102b may be formed on an upper portion of the first side 110. While the housing 10 is supported in the second position P2, the first side 110 faces the rear, and thus the protruding rib 102b may also protrude rearward.

The contact rib accommodating groove 102c may be recessed in the outer perimeter of the rotating part 102. The contact rib accommodating groove 102c may be provided to accommodate the contact rib 54 while the housing 10 is supported in the first position P1. The contact rib accommodating groove 102c may be formed in an upper portion of the second side 120.

The height adjustment member 100 may include fixing grooves 111 and 121, a grip part 112, and mounting grooves 122 and 123a formed to correspond to the mounting protrusions 51d and 51e.

The fixing grooves 111 and 121 may be coupled to a fixing protrusion 12f of the rear cover 12. The fixing grooves 111 and 121 may include a first fixing groove 111 and a second fixing groove 121. The first fixing groove 111 may be formed by being recessed in the first side 110. While the housing 10 is supported in the first position P1, the first fixing groove 111 may be coupled to the fixing protrusion 12f to prevent the stand 30 from being separated from the rear cover 12. The second fixing groove 121 may be formed by being recessed in the second side 120. While the housing 10 is supported in the second position P2, the second fixing groove 121 may be coupled to the fixing protrusion 12f to prevent the stand 30 from being separated from the rear cover 12.

While the housing 10 is supported in the first position P1 by the support protrusion 52, the first fixing groove 111 and the fixing protrusion 12f may be coupled. That is, the fixing protrusion 12f may protrude toward the base 51, and the first fixing groove 111 may be recessed to correspond to the protruding fixing protrusion 12f. Therefore, the stand 30 coupled to the rear cover 12 may not be separated downward without a separate additional part.

The grip part 112 may be provided to allow a user to rotate the height adjustment member 100. The grip part 112 may be formed by being recessed in the first side 110. The grip part 112 may be formed below the first side 110.

A configuration while the housing 10 is supported in the first position P1 will be described with reference to FIG. 6. The height adjustment member 100 may be accommodated between the housing 10 and the stand 30. Specifically, the height adjustment member 100 may be disposed between the rear cover 12 and the base 51. The height adjustment member 100 may be disposed in the recess 12a.

The support protrusion 52 provided in the stand 30 may support the housing 10 in the first position P1. The housing support surface 52a of the support protrusion 52 may come into contact with the contact surface 12c of the rear cover 12 to support the housing 10 in the first position P1. That is, while the housing 10 is placed in the first position P1, an upper end of the height adjustment member 100 may be positioned at a lower level than the support protrusion 52 so that the support protrusion 52 may support the housing 10.

The contact surface 12c may be an upper surface of the recess 12a. That is, the support protrusion 52 may stably support the rear cover 12 before the height adjustment member 100 is rotated.

The bottom chassis 40 may include a reinforcing rib 41. The reinforcing rib 41 may be provided on an upper side of the contact surface 12c to reinforce the strength of the rear cover 12. The reinforcing rib 41 may protrude toward the base 51. The reinforcing rib 41 may come into contact with the rear cover 12 forming the contact surface 12c to reinforce the strength of the rear cover 12. Even when a size of the display panel 20 increases and a load inside the housing 10 increases, the reinforcing rib 41 may allow the support protrusion 52 to stably support the load without damaging the rear cover 12.

The stand 30 may include the contact rib 54. The contact rib 54 may protrude toward the rear cover 12 from the base 51. The contact rib 54 may be accommodated in the contact rib accommodating groove 102c.

The first mounting protrusion 51d may be provided on the second side 120. The first mounting protrusion 51d may be formed to correspond to the first mounting groove 122.

Figure 7:
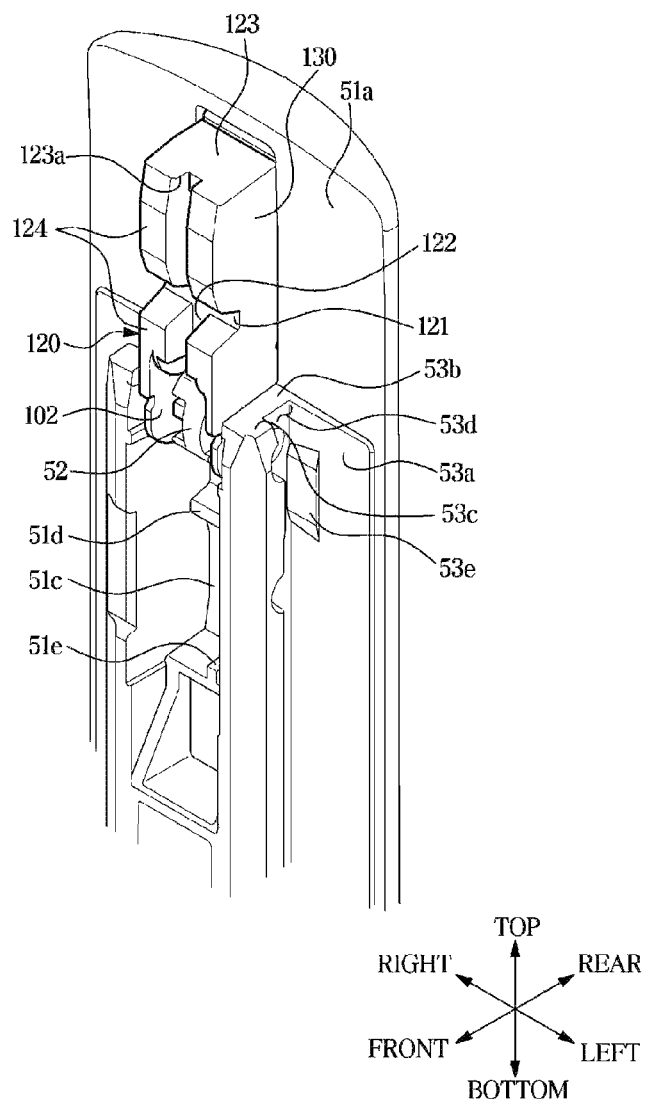
FIG. 7 is a view illustrating the height adjustment member while the stand and the housing are supported in a second position in the display apparatus illustrated in FIG. 1.
Figure 8:
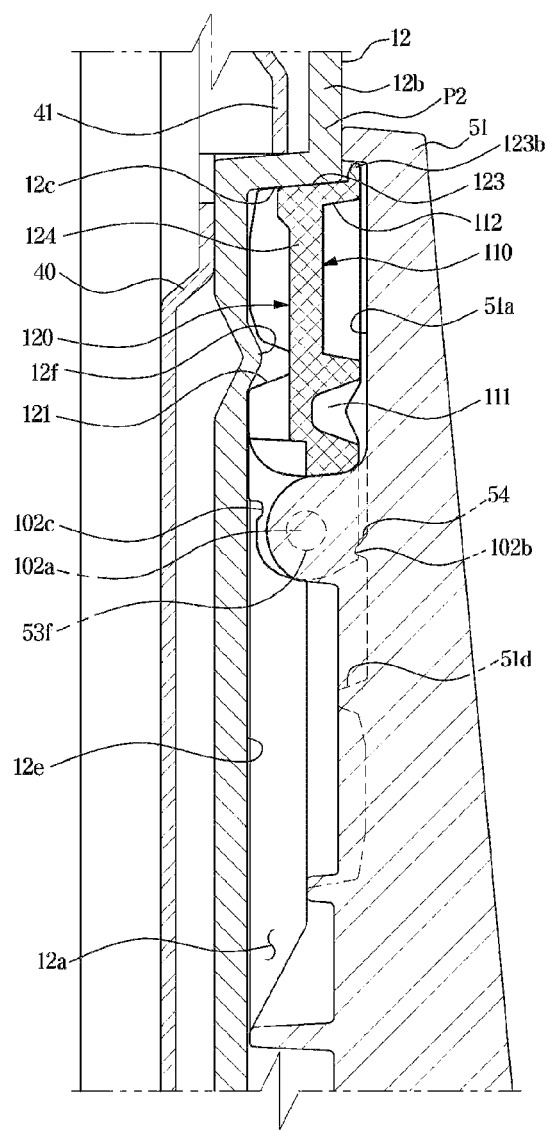
FIG. 8 is a cross-sectional view illustrating the height adjustment member while the housing is supported in the second position in the display apparatus illustrated in FIG. 7.

FIG. 7 is a view illustrating the height adjustment member while the stand and the housing are supported in the second position in the display apparatus illustrated in FIG. 1. FIG. 8 is a cross-sectional view illustrating the height adjustment member while the housing is supported in the second position in the display apparatus illustrated in FIG. 7.

Referring to FIGS. 7 and 8, the height adjustment member 100 may be rotated. The rotating part 102 may be coupled to the coupling part 53 and rotated. That is, the height adjustment member 100 may be rotated using the rotating shaft 102a and the coupling hole 53f. In this case, the height adjustment member 100 may support the housing 10 in the second position P2. A support surface 123 of the height adjustment member 100 may come into contact with the contact surface 12c of the rear cover 12 to support the housing 10. The support surface 123 may stably support the housing 10 in the second position P2.

While the height adjustment member 100 supports the housing 10 in the second position P2, the first side 110 may face rearward, and the second side 120 may face forward. That is, the first side 110 may face the recessed part 51a of the base 51, and the second side 120 may face the mounting part accommodating surface 12e.

The fixing ribs 51g may come into contact with the both side surfaces 130 of the height adjustment member 100. That is, the fixing ribs 51g may be fitted onto and coupled to the height adjustment member 100. Accordingly, the height adjustment member 100 may not be reversely rotated. In other words, while the height adjustment member 100 supports the housing 10 in the second position P2, the height adjustment member 100 may stably support the housing 10 without being separated. As a result, the height adjustment member 100 may be stably mounted in the recessed part 51a. However, the user may apply a force to separate the height adjustment member 100 from the fixing ribs 51g coupled thereto. That is, the user may move the height adjustment member 100 to the position at which the housing 10 is supported in the first position P1.

The contact rib 54 may come into contact with the protruding rib 102b. While the height adjustment member 100 supports the housing 10 in the second position P2, the protruding rib 102b may be disposed below the contact rib 54. Accordingly, the reverse rotation of the height adjustment member 100 may be prevented. In other words, in order for the housing 10 to return to the position at which the housing 10 is supported in the first position P1, the protruding rib 102b should be moved upward. However, since the contact rib 54 is disposed above the protruding rib 102b in the second position P2, the protruding rib 102b may not be moved upward. That is, the height adjustment member 100 cannot be reversely rotated and may be fixed in the second position P2. However, the user may apply a force to move the height adjustment member 100 to the position at which the housing 10 is supported from the first position P1.

While the housing 10 is supported in the second position P2 by the height adjustment member 100, the second fixing groove 121 and the fixing protrusion 12f may be coupled. That is, the fixing protrusion 12f may protrude toward the base 51, and the second fixing groove 121 may be recessed to correspond to the protruding fixing protrusion 12f. Therefore, the stand 30 coupled to the rear cover 12 may not be separated downward without a separate additional part.

The height adjustment member 100 may further include a contact protrusion 123b. The contact protrusion 123b may protrude upward while the housing 10 is supported in the second position P2. That is, the contact protrusion 123b may protrude upward in the state in which the height adjustment member 100 is rotated. The contact protrusion 123b may protrude upward from one end of the support surface 123. The contact protrusion 123b may come into contact with the upper surface 51f of the recessed part. Specifically, the contact protrusion 123b may be fitted onto the upper surface 51f of the recessed part. Accordingly, the height adjustment member 100 may not be reversely rotated. In other words, while the height adjustment member 100 supports the housing 10 in the second position P2, the height adjustment member 100 may stably support the housing 10 without being separated. As a result, the height adjustment member 100 may be stably mounted in the recessed part 51a.

Figure 9:
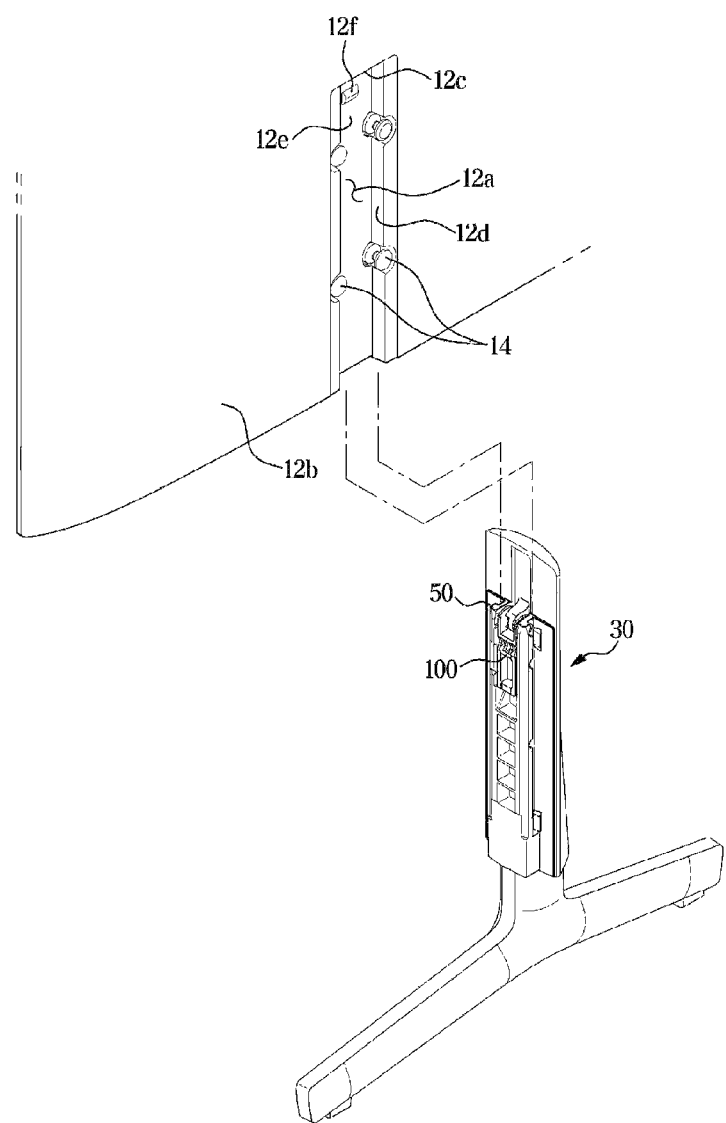
FIG. 9 is a view illustrating a coupling relationship between the housing and the stand in the display apparatus illustrated in FIG. 1.

FIG. 9 is a view illustrating a coupling relationship between the housing and the stand in the display apparatus illustrated in FIG. 1.

Referring to FIG. 9, the stand 30 may be slidably coupled to the rear cover 12. The strength reinforcing members 14 may be disposed between the sliding parts 53d described above. That is, the strength reinforcing members 14 may be disposed between the first flange part 53a, the second flange part 53b, and the third flange part 53c. The strength reinforcing members 14 may come into contact with the step 53e. The strength reinforcing members 14 may allow the housing 10 including the rear cover 12 to be coupled to the stand 30. Accordingly, the stand may not be separated in a front-rear direction from the housing 10.

Although not illustrated, the strength reinforcing members 14 may couple the bottom chassis 40 and the rear cover 12. Further, the strength reinforcing members 14 may couple the rear cover 12 and the stand 30. That is, the strength reinforcing members 14 may couple the bottom chassis 40, the rear cover 12, and the stand 30. The strength reinforcing members 14 may couple the above components and prevent the above components from being separated from each other. The strength reinforcing members 14 may pass through the rear cover 12 and the bottom chassis 40. Through-holes (not illustrated) corresponding to the strength reinforcing members 14 may be provided in the rear cover 12 and the bottom chassis 40. The number of strength reinforcing members 14 is not limited to that illustrated in the drawings.

The rear cover 12 may include the fixing protrusion 12f that protrudes rearward. The fixing protrusion 12f may protrude toward the base 51 while the stand 30 is coupled to the housing 10. The fixing protrusion 12f may be coupled to the first fixing groove 111 while the housing 10 is supported in the first position P1, to prevent the stand 30 from being separated from the housing 10 in the top-bottom direction. Further, the fixing protrusion 12f may be coupled to the second fixing groove 121 while the housing 10 is supported in the second position P2, to prevent the stand 30 from being separated from the housing 10 in the top-bottom direction.

The rear cover 12 may include the recess 12a on which the mounting part 50 of the stand 30 is mounted, a cover part 12b that covers a rear of the display panel 20, the contact surface 12c which is the upper surface of the recess 12a, and is supported in the first position P1 by the support protrusion 52 and supported in the second position P2 by the support surface 123 of the height adjustment member 100, both side surfaces 12d of the recess 12a, and the mounting part accommodating surface 12e. The recess 12a may be recessed in the cover part 12b to accommodate the mounting part 50.

Figure 10:
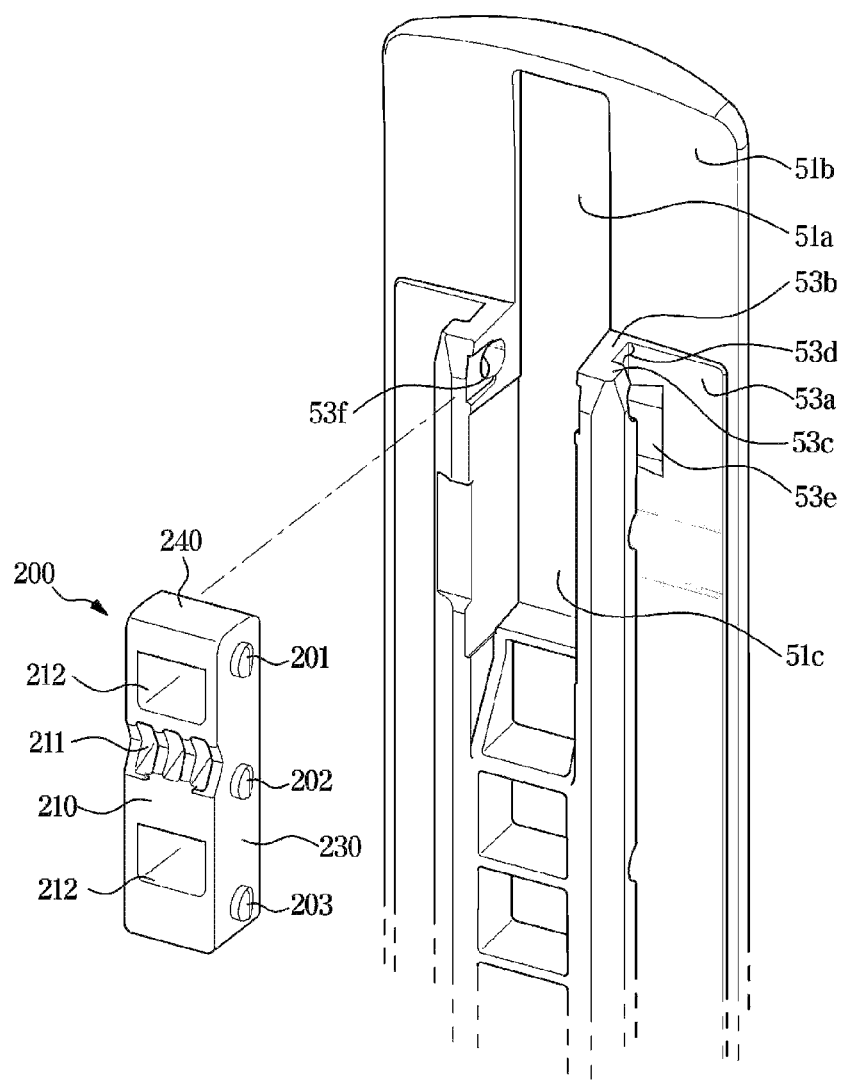
FIG. 10 is a view illustrating a stand and a height adjustment member while a housing is supported in a first position in a display apparatus according to another embodiment of the disclosure.

FIG. 10 is a view illustrating a stand and a height adjustment member while a housing is supported in a first position in a display apparatus according to another embodiment of the disclosure.

Referring to FIG. 10, the display apparatus may include a height adjustment member 200. The height adjustment member 200 may be mounted on a stand 30 to adjust a height of a housing 10.

The height adjustment member 200 may include a first side 210 facing forward, and a second side 220 facing rearward while the housing 10 is supported in a first position P1 by a support protrusion 52. That is, the first side 210 may face a mounting part accommodating surface 12e, and the second side 220 may face a recessed part 51a of a base 51. Further, the height adjustment member 200 may include both side surfaces 230 provided between the first side 210 of and the second side 220. That is, the height adjustment member 200 may include a left surface 230 and a right surface 230.

Coupling protrusions 201, 202, and 203 may be provided on the both side surfaces 230.

The coupling protrusions 201, 202, and 203 may be detachably coupled to coupling holes 53f. The coupling protrusions 201, 202, and 203 may be fitted into and coupled to the coupling holes 53f. The coupling protrusions 201, 202, and 203 may protrude from the both side surfaces 230. The coupling protrusions 201, 202, and 203 may protrude from the left surface 230 and the right surface 230 of the height adjustment member 200.

A plurality of coupling protrusions 201, 202, and 203 may be provided. The plurality of coupling protrusions 201, 202, and 203 may include a first coupling protrusion 201, a second coupling protrusion 202, and a third coupling protrusion 203. The first coupling protrusion 201 may be provided at an uppermost side of the plurality of coupling protrusions 201, 202, and 203. That is, the first coupling protrusion 201 may be provided above the second coupling protrusion 202 and the third coupling protrusion 203. The second coupling protrusion 202 may be provided below the first coupling protrusion 201. The second coupling protrusion 202 may be provided between the first coupling protrusion 201 and the third coupling protrusion 203 in a top-bottom direction. The third coupling protrusion 203 may be provided below the first coupling protrusion 201 and the second coupling protrusion 202. That is, the third coupling protrusion 203 may be provided at a lowermost side.

Therefore, the user may separate the coupling protrusions 201, 202, and 203 from the coupling holes 53f, and may arbitrarily determine a position at which the housing 10 is supported by coupling one coupling protrusion among the plurality of coupling protrusions 201, 202, and 203 to the coupling hole 53f.

The height adjustment member 200 may include a support surface 240. The support surface 240 may support the housing 10 regardless of the first position P1, a second position P2, and a third position P3. The support surface 240 may become an upper surface of the height adjustment member 200.

The height adjustment member 200 may include grip parts 112. The grip parts 212 may be provided to allow the user to separate the height adjustment member 200 from the mounting part 50. The grip parts 212 may be formed by being recessed in the first side 210. The grip parts 212 may be formed in upper and lower portions of the first side 210. However, the number and shape of grip parts 212 are not limited to those illustrated in the drawing.

The height adjustment member 200 may include fixing grooves 211. The fixing grooves 211 may be coupled to fixing protrusions 12f of a rear cover 12. The fixing grooves 211 may be formed by being recessed in the first side 210. That is, the fixing protrusions 12f may protrude toward the base 51, and the fixing grooves 211 may be recessed to correspond to the protruding fixing protrusions 12f. The fixing grooves 211 may be coupled to the fixing protrusions 12f regardless of the first position P1, the second position P2, and the third position P3. Since the fixing grooves 211 and the fixing protrusions 12f are coupled to each other, it is possible to prevent the stand 30 from being separated from the rear cover 12. Therefore, the stand 30 coupled to the rear cover 12 may not be separated downward without a separate additional part.

Figure 11:
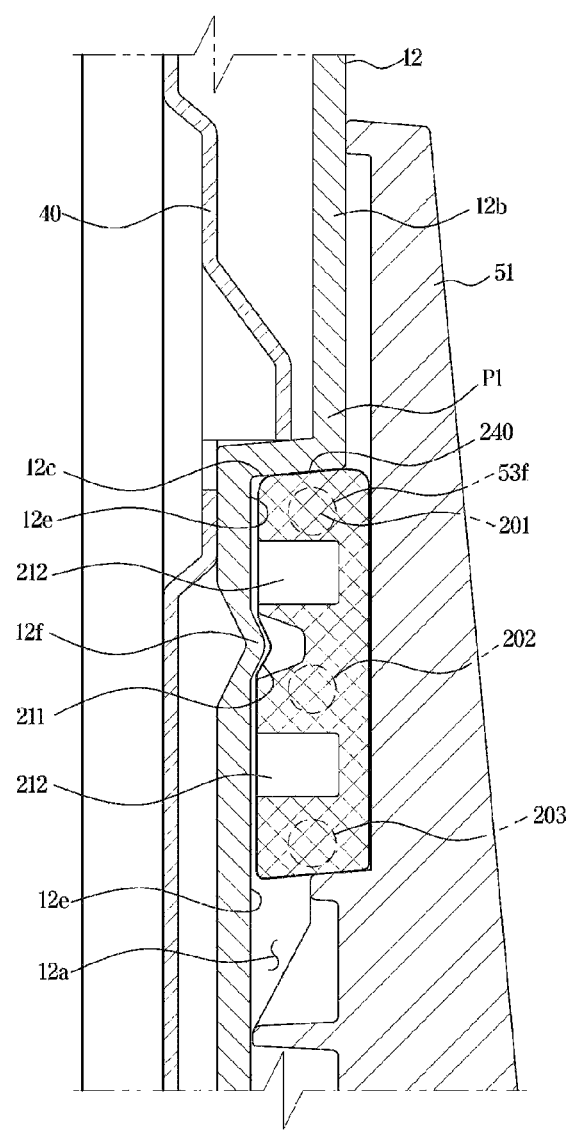
FIG. 11 is a cross-sectional view illustrating an arrangement of the height adjustment member while the housing is supported in the first position in the display apparatus illustrated in FIG. 10.
Figure 12:
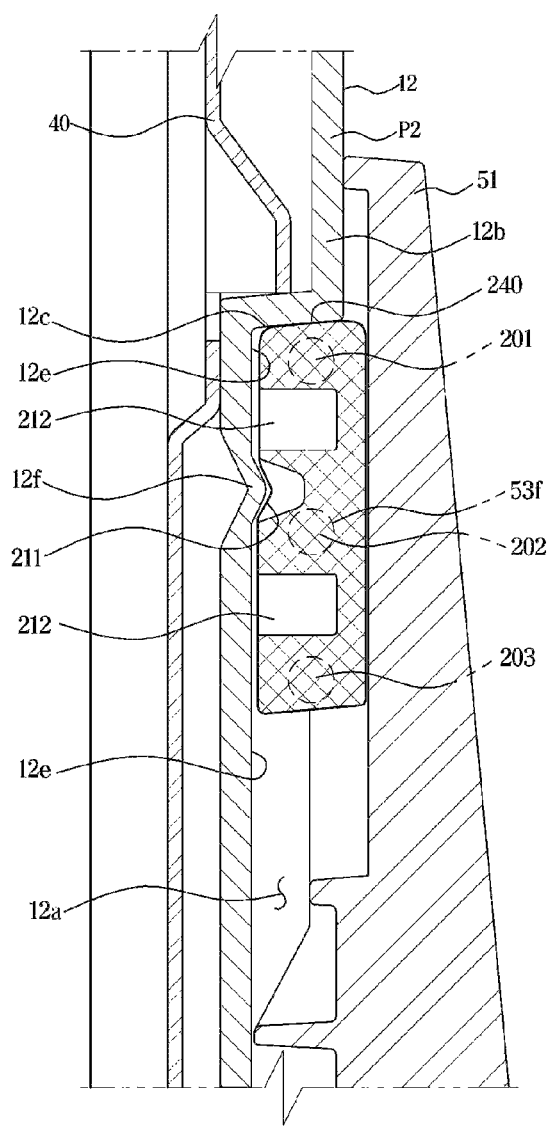
FIG. 12 is a cross-sectional view illustrating a position of the height adjustment member while the housing is supported in a second position in the display apparatus illustrated in FIG. 10.
Figure 13:
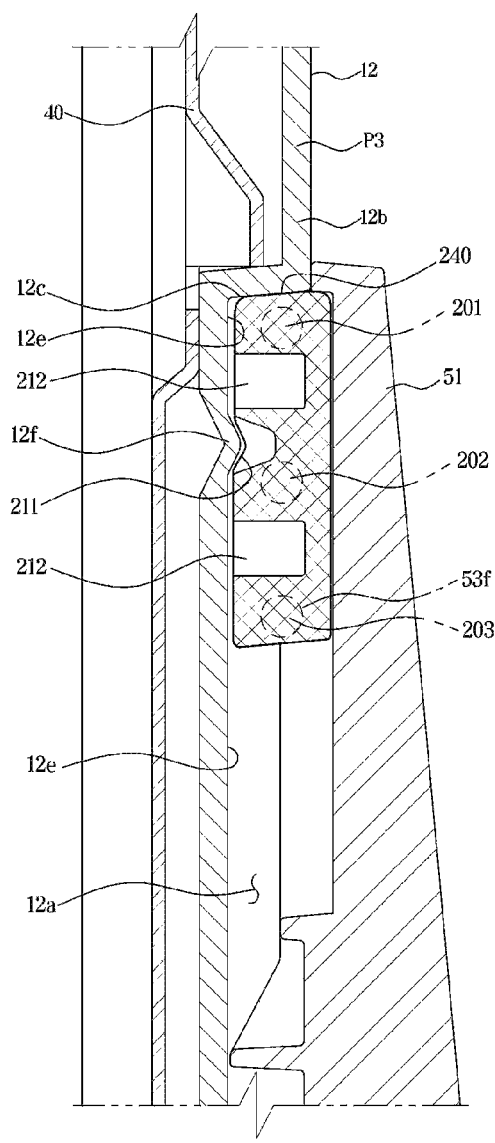
FIG. 13 is a cross-sectional view illustrating a position of the height adjustment member while the housing is supported in a third position in the display apparatus illustrated in FIG. 10.

FIG. 11 is a cross-sectional view illustrating an arrangement of the height adjustment member while the housing is supported in the first position in the display apparatus illustrated in FIG. 10. FIG. 12 is a cross-sectional view illustrating a position of the height adjustment member while the housing is supported in the second position in the display apparatus illustrated in FIG. 10. FIG. 13 is a cross-sectional view illustrating a position of the height adjustment member while the housing is supported in the third position in the display apparatus illustrated in FIG. 10.

In FIG. 11, the housing 10 may be supported in the first position P1 by the height adjustment member 200. That is, the first coupling protrusion 201 and the coupling hole 53f may be coupled to each other. The support surface 240 may be in contact with a contact surface 12c of the rear cover 12 so that the height adjustment member 200 may support the housing 10.

In FIG. 12, the housing 10 may be supported in the second position P2 by the height adjustment member 200. That is, the second coupling protrusion 202 and the coupling hole 53f may be coupled to each other. The support surface 240 may be in contact with the contact surface 12c of the rear cover 12 so that the height adjustment member 200 may support the housing 10.

In FIG. 13, the housing 10 may be supported in the third position P3 by the height adjustment member 200. That is, the third coupling protrusion 203 and the coupling hole 53f may be coupled to each other. The support surface 240 may be in contact with the contact surface 12c of the rear cover 12 so that the height adjustment member 200 may support the housing 10.

Accordingly, the height of the housing 10 may be adjusted to the height of the first position P1, the second position P2, or the third position P3 using the height adjustment member 200. The heights of the housing 10 and the display panel 20 may be adjusted using the height adjustment member 200 according to needs of the user.

Specific embodiments have been illustrated and described above. However, the disclosure is not limited to the above embodiments and, and as claimed in the claims below, various modifications may be made without departing from the spirit and scope of the disclosure by those skilled in the art to which the disclosure pertains.

What is claimed is:

1. A display apparatus comprising:
a display panel;
a housing accommodating the display panel and including a rear cover covering a rear of the display panel;
a stand including a base, and a support protrusion protruding from the base and configured to support the housing in a first position at a first height; and
a height adjustment member coupled to the stand and configured to support the housing in a second position at a second height,
wherein a portion of the height adjustment member configured to contact the housing to support the housing in the second position does not contact the housing in the first position.

2. The display apparatus of claim 1, wherein
while the housing is supported in the first position, the support protrusion protrudes toward the rear cover, and an upper end of the height adjustment member is positioned at a lower level than the support protrusion.

3. The display apparatus of claim 2, wherein
the height adjustment member includes a support surface rotatably coupled to the support protrusion and supporting the housing while the housing is supported in the second position.

4. The display apparatus of claim 3, wherein
the height adjustment member includes a first side facing the rear cover and a second side facing the base while the housing is supported in the first position, and
the first side faces the base and the second side faces the rear cover according to rotation of the height adjustment member.

5. The display apparatus of claim 4, wherein
the rear cover includes a fixing protrusion protruding toward the stand while the housing is supported in the first position or the second position, and
the height adjustment member includes a first fixing groove provided in the first side and configured to be coupled to the fixing protrusion while the housing is supported in the first position, and a second fixing groove provided in the second side and configured to be coupled to the fixing protrusion while the housing is supported in the second position.

6. The display apparatus of claim 4, wherein the height adjustment member includes a grip part recessed inward of the height adjustment member to rotate the height adjustment member.

7. The display apparatus of claim 1, wherein
the rear cover includes a contact surface in contact with the support protrusion so as to be supported by the support protrusion while the housing is supported in the first position.

8. The display apparatus of claim 7, wherein
the rear cover includes a recess to which the stand is slidably coupleable, and
the contact surface is supported by the support protrusion while the housing is supported in the second position.

9. The display apparatus of claim 8, wherein
the stand includes a coupling part protruding toward the rear cover from the base while the housing is supported in the second position, and a coupling hole formed in the coupling part, and
the height adjustment member includes a rotating shaft rotatably coupled to the coupling hole while the housing is supported in the second position.

10. The display apparatus of claim 9, wherein
the stand includes a contact rib protruding toward the height adjustment member from the base while the housing is supported in the second position, and
the height adjustment member includes a rotating part in which the rotating shaft is formed, and a protruding rib provided in the rotating part to come into contact with the contact rib and fix the height adjustment member while the housing is supported in the second position.

11. The display apparatus of claim 10, wherein the stand includes a plurality of fixing ribs protruding toward both side surfaces of the height adjustment member from an upper portion of the base, and configured to fit onto and couple to the height adjustment member, while the housing is supported in the second position.

12. The display apparatus of claim 7, further comprising:
a bottom chassis disposed between the display panel and the rear cover,
wherein the bottom chassis includes a reinforcing rib protruding toward the stand to support the contact surface while the housing is supported in the second position.

13. The display apparatus of claim 1, wherein the height adjustment member is accommodated between the rear cover and the base while the housing is supported in the second position.

14. The display apparatus of claim 13, further comprising:
accommodating walls protruding from the base; and
a mounting part between the accommodating walls and on which the height adjustment member is mounted.

15. The display apparatus of claim 14, wherein the accommodating walls are in contact with the rear cover while the housing is supported in the second position.

16. A display apparatus comprising:
a display panel;
a housing accommodating the display panel and including a rear cover covering a rear of the display panel;
a stand including a base, and a support protrusion protruding from the base and configured to support the housing in a first position at a first height; and
a height adjustment member coupled to the stand and configured to support the housing in a second position at a second height,
wherein the height adjustment member includes a first side facing the rear cover and a second side facing the base while the housing is supported in the first position, and
the first side faces the base and the second side faces the rear cover according to a rotation of the height adjustment member to support the housing in the second position.

17. A display apparatus comprising:
a display panel;
a housing accommodating the display panel and including a rear cover covering a rear of the display panel;
a stand including a base, and a support protrusion protruding from the base and configured to support the housing in a first position at a first height; and
a height adjustment member coupled to the stand and configured to support the housing in a second position at a second height,
wherein the rear cover includes a contact surface in contact with the support protrusion so as to be supported by the support protrusion while the housing is supported in the first position.

* * * * *